United States Patent
Reshef et al.

(10) Patent No.: US 7,479,916 B1
(45) Date of Patent: Jan. 20, 2009

(54) HIGH RESOLUTION COLUMN-BASED ANALOG-TO-DIGITAL CONVERTER WITH WIDE INPUT VOLTAGE RANGE FOR DENTAL X-RAY CMOS IMAGE SENSOR

(75) Inventors: Raz Reshef, Migdal Haemek (IL); Erez Sarig, Migdal Haemek (IL); Shay Alfassi, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 11/833,770

(22) Filed: Aug. 3, 2007

(51) Int. Cl.
 *H03M 1/56* (2006.01)
(52) U.S. Cl. ...................... 341/169; 348/308
(58) Field of Classification Search ........ 341/169, 341/155, 120, 118; 348/308, 294, 122, 222.1, 348/241, 386, 311, 302, 243; 382/210, 103, 382/312
See application file for complete search history.

(56) References Cited

U.S. PATENT DOCUMENTS

2003/0202111 A1* 10/2003 Park ........................... 348/243

* cited by examiner

*Primary Examiner*—Rexford Barnie
*Assistant Examiner*—Joseph Lauture
(74) *Attorney, Agent, or Firm*—Bever, Hoffman & Harms, LLP; E. Eric Hoffman

(57) ABSTRACT

An imaging system including column-parallel ADCs that operate in response to a single slope global ramp signal and a matched global ramp line signal that has a voltage representative of a dark pixel value. The signal paths of the global ramp signal and the matched global ramp line signal are matched to minimize noise effects. Prior to performing a pixel read operation, the global ramp signal is increased through a first voltage range (below the dark pixel value) to ensure that the column-parallel ADCs are operating in a linear range. The first voltage range can be adjusted to cancel offset error associated with the column parallel ADCs. The column-parallel ADCs provide output signals having a full voltage swing between $V_{DD}$ and ground.

20 Claims, 12 Drawing Sheets

HIGH RESOLUTION COLUMN-BASED ANALOG-TO-DIGITAL CONVERTER WITH WIDE INPUT VOLTAGE RANGE FOR DENTAL X-RAY CMOS IMAGE SENSOR

FIELD OF THE INVENTION

The present invention relates to the use of improved column parallel analog-to-digital converters (ADCs) with a CMOS image sensor to implement a digital X-Ray imaging system.

RELATED ART

Column parallel ADCs have been used in CMOS image sensor applications, including cellular phone cameras. However, conventional column parallel ADCs are not capable of meeting the more advanced requirements of an X-ray CMOS image sensor. These advanced requirements include a larger input voltage window, a higher ADC resolution, lower noise and a larger area.

More specifically, a dental X-ray CMOS image sensor must exhibit a relatively high resolution digital data output of at least about 12 to 16 bits. To accomplish this, an X-ray CMOS image sensor requires a relatively large input voltage window. In contrast, the column parallel ADCs used in cell phone camera applications are only capable of providing digital output data of about 10 bits, and have an input voltage window of about 1 Volt or less. In addition, fixed-pattern-noise (FPN) and power consumption are significant issues in X-ray CMOS image sensors. The supply lines associated with column parallel ADCs are very long and exhibit relatively high resistances. Large power consumption within the column parallel ADCs increases the voltage (IR) drop along these supply lines, thereby causing a voltage gradient to exist in the outputs of the column parallel ADCs.

Furthermore, because dental X-Ray sensors are large, column parallel ADCs are typically referenced to different 'local' grounds, which can also lead to inconsistent output signals and noise.

Moreover, circuitry such as analog amplifiers and buffers is typically located between the pixel array outputs and the column parallel ADCs, thereby introducing non-ideal circuit paths.

All of these factors prevent conventional column parallel ADCs from being used with a CMOS pixel array to create a digital X-ray imaging system.

It would therefore be desirable to have column parallel ADCs capable of operating with a CMOS image sensor to meet the operating requirements of a dental X-ray image sensor. It would further be desirable for such a dental X-ray image sensor to be fabricated using a low cost manufacturing process.

SUMMARY

In accordance with the present invention, a unique 12-bit single-slope column parallel ADC configuration is provided. Each column of a CMOS pixel array is directly connected to a corresponding one of these column-parallel ADCs, such that each column-parallel ADC receives the analog pixel signal level voltage and the analog pixel reset level voltage associated with a pixel read operation. Each column-parallel ADC is also commonly coupled to receive a global ramp signal and a matched global ramp line signal. The global ramp signal is a constant slope signal applied to each single-slope column parallel ADC. The purpose of the matched global ramp line is to match differential inputs of the column parallel ADCs in such a manner that noise will appear on both inputs as a common signal and therefore be attenuated significantly. Referencing pixel signals and reset levels to the global ramp line and the matched global ramp line, rather than to a local column ground, is especially important for large area applications such as dental X-ray applications.

The matched global ramp line signal is maintained at a voltage representative of a dark pixel value. Prior to performing a pixel read operation, the global ramp signal is increased through a first voltage range (below the dark pixel value) to ensure that the column-parallel ADCs are operating in a linear range during the pixel read operation.

The present invention will be more fully understood in view of the following description and drawings.

DETAILED DESCRIPTION

Figure 1:
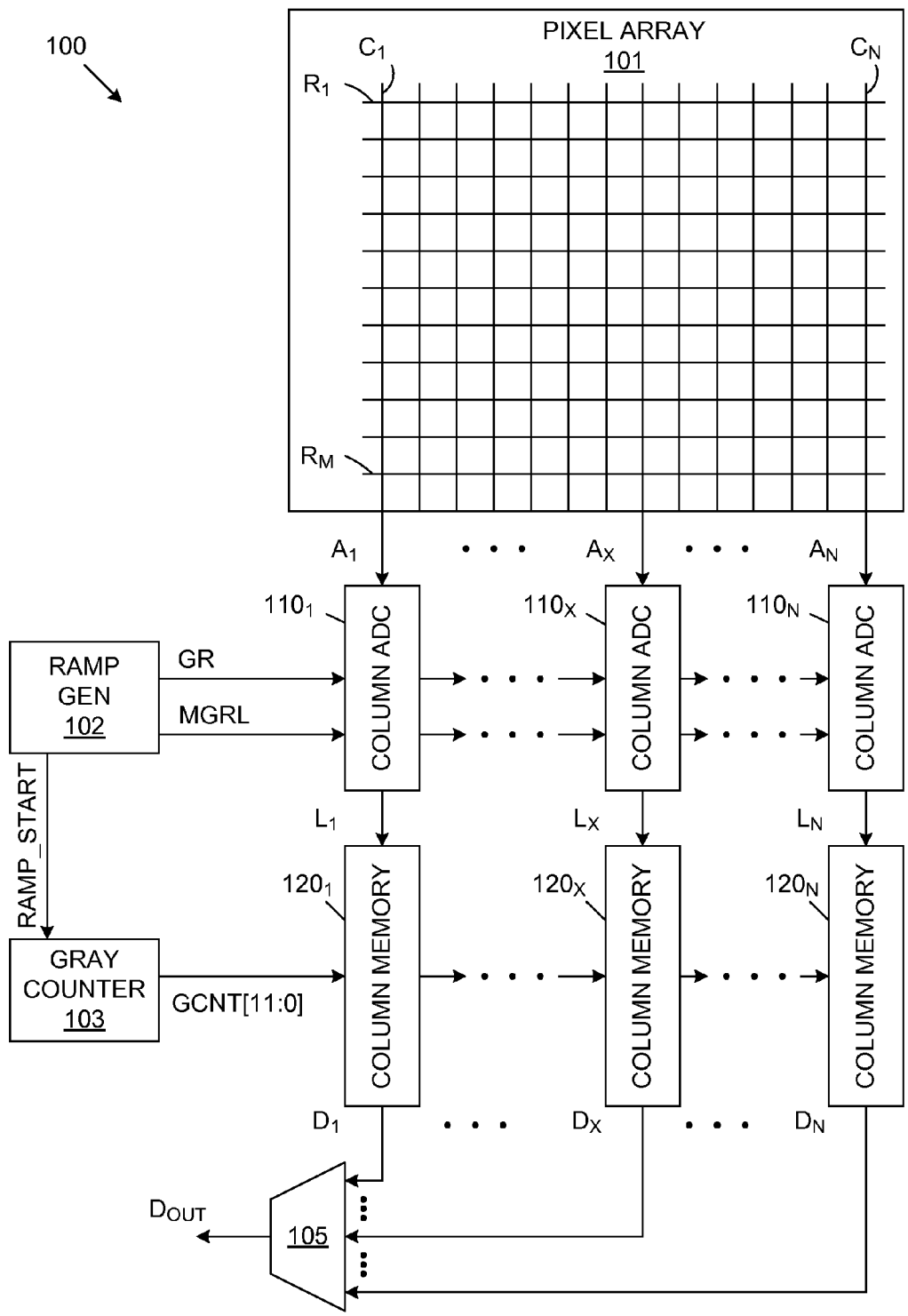
FIG. 1 is a block diagram of a digital X-ray imaging system in accordance with one embodiment of the present invention.

FIG. 1 is a block diagram of a digital X-ray imaging system 100, which is fabricated using a CMOS process. Digital X-ray imaging system 100 includes CMOS pixel array 101, ramp generation circuit 102, Gray counter 103, multiplexer 105, column-parallel analog-to-digital (ADC) circuits $110_1$-$110_N$ and column-parallel memory circuits $120_1$-$120_N$. In accordance with one embodiment, all of the above-described elements of digital X-ray imaging system 100 are fabricated on the same integrated circuit chip.

CMOS pixel array 101 includes a plurality pixels arranged in M rows (designated by row lines $R_1$-$R_M$) and N columns (designated by column lines $C_1$-$C_N$). In accordance with one embodiment, scintillating material, which is required to convert X-rays to optical photons, is integrated with the wafer on which CMOS pixel array 101 is fabricated. Such a structure is described in commonly owned U.S. patent application Ser. No. 11/563,129, which is hereby incorporated by reference in its entirety.

In general, X-ray imaging system 100 operates as follows. Pixels in the CMOS pixel array 101 are initially charged to a predetermined state. X-rays are then directed toward CMOS pixel array 101 (through the item to be imaged). The X-rays excite the scintillating material, thereby generating a number of optical photons representative of the intensity of the received X-rays. The optical photons are directed toward the pixels of CMOS pixel array 101. The initial predetermined charge stored by each pixel is reduced by an amount corresponding with the number of optical photons received by that pixel. At the end of the X-ray exposure, each of the pixels stores a corresponding 'exposed' charge. The difference between the initial predetermined charge and the exposed charge is used to determine the value of the pixel in the resulting image.

CMOS pixel array 101 is read on a per row basis. Thus, when a read operation is performed on the first row ($R_1$) of CMOS pixel array 101, each of the N pixels in this first row is coupled to the corresponding column lines $C_1$-$C_N$. At this time, analog pixel signals $A_1$-$A_N$ (which are representative of the charges stored by the corresponding pixels in the first row) are provided on corresponding column lines $C_1$-$C_N$. Column lines $C_1$-$C_N$ are directly connected to column parallel ADC circuits $110_1$-$110_N$, respectively, such that the analog pixel signals $A_1$-$A_N$ are received by column ADC circuits $110_1$-$110_N$, respectively.

As described in more detail below, ramp generation circuit 102 generates a global ramp signal (GR) and a matched global ramp line signal (MGRL), which are applied to each of the column parallel ADC circuits $110_1$-$110_N$ in parallel. In response, column parallel ADC circuits $110_1$-$110_N$ provide latch signals $L_1$-$L_N$, respectively, to column memory blocks $120_1$-$120_N$, respectively. As described in more detail below, each of latch signals $L_1$-$L_N$ exhibits a full logic voltage swing (i.e., between ground and the $V_{DD}$ supply voltage).

Each of column memory blocks $120_1$-$120_N$ is further coupled to receive a 12-bit count value GCNT[11:0] from Gray code counter 103. As described below, each of column memory blocks $120_1$-$120_N$ latches the current 12-bit count value GCNT[11:0] when the corresponding one of latch signals $L_1$-$L_N$ is activated to a logic high state. The count values latched in column memory blocks $120_1$-$120_N$ are provided as 12-bit digital output values $D_1$-$D_N$, respectively. Column memory blocks $120_1$-$120_N$ provide the corresponding digital output values $D_1$-$D_N$ to multiplexer 105. Multiplexer 105 is controlled to sequentially route the output values $D_1$-$D_N$ as a digital output value $D_{OUT}$, which is used to generate the X-ray image.

Figure 2:
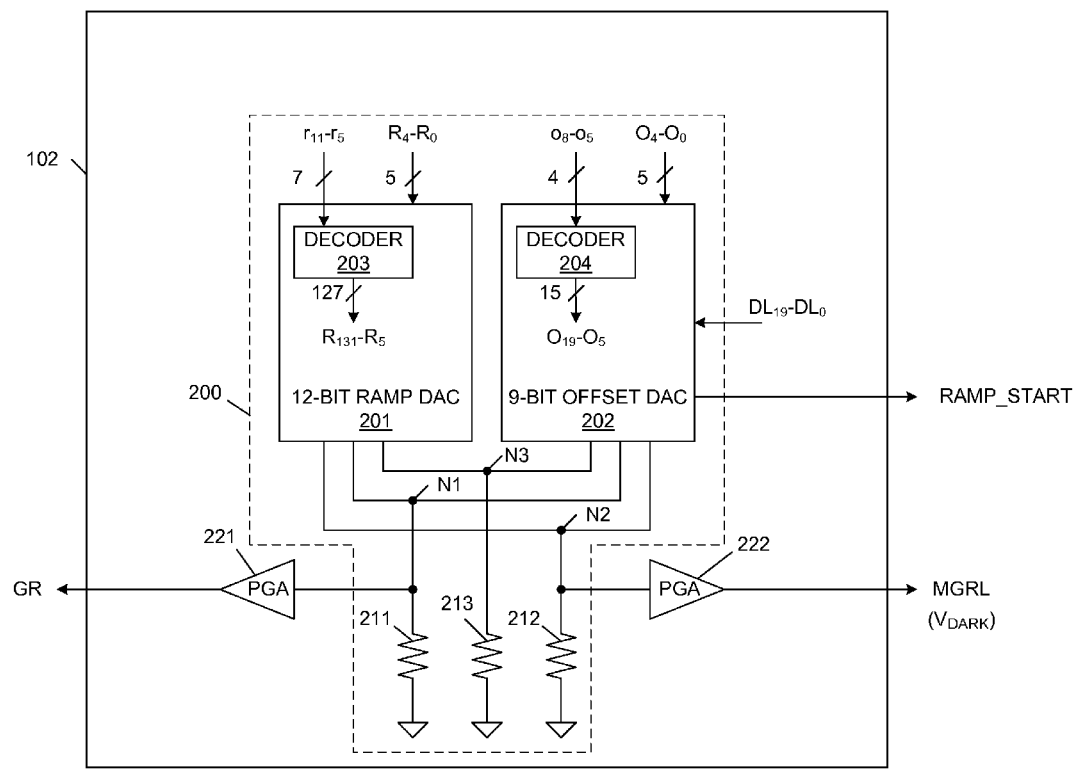
FIG. 2 is a circuit diagram of a ramp generation circuit in accordance with one embodiment of the present invention

FIG. 2 is a circuit diagram of ramp generation circuit 102 in accordance with one embodiment of the present invention. In this embodiment, ramp generation circuit 102 includes a digital-to-analog converter (DAC) 200 having output terminals coupled to programmable gain amplifiers 221-222. DAC 200 includes a 12-bit ramp DAC 201, a 9-bit offset DAC 202, and resistors 211-213. Ramp DAC 201 provides three analog output signals to nodes N1-N3 in response to a 12-bit ramp control signal, which includes most significant bits (MSBs) $r_{11}$-$r_5$ and least significant bits (LSBs) $R_4$-$R_0$. Ramp DAC 201 includes a decoder 203, which decodes the MSBs $r_{11}$-$r_5$ to provide ramp control bits $R_{131}$-$R_5$. In the described examples, ramp control bits $R_{131}$-$R_5$ are equally weighted, and ramp control bits $R_4$-$R_0$ have binary weighting. As described in more detail below, MSBs $r_{11}$-$r_5$ and LSBs $R_4$-$R_0$ and the 12-bit count value GCNT[11:0] start after the offset DAC 202 stops counting. Similarly, offset DAC 202 provides three analog output signals to nodes N1-N3 in response to a 9-bit offset control signal, which includes MSBs $o_8$-$o_5$ and LSBs $O_4$-$O_0$. Offset DAC 202 includes a decoder 204, which decodes the MSBs $o_8$-$o_5$ to provide offset control bits $O_{19}$-$O_5$. In the described examples, offset control bits $O_{19}$-$O_5$ are equally weighted, and offset control bits $O_4$-$O_0$ have binary weighting.

Offset DAC 202 also receives a 20-bit dark level control signal $DL_{19}$-$DL_0$, which is used to control corresponding switches in offset DAC 202. The dark level control signals $DL_{19}$-$DL_0$ are controlled such that enabled transistor switches coupled to node N2 correspond with enabled switches coupled to node N1 under dark pixel conditions. The dark level control signals $DL_{19}$-$DL_0$ are fixed so that a constant voltage ($V_{RISE}$, which is described in more detail below) appears on node N2.

The resulting analog signals on nodes N1 and N2 are provided to programmable gain amplifiers 221 and 222, respectively. In response, programmable gain amplifiers 221 and 222 provide the global ramp (GR) signal and the matched global ramp line (MGRL) signal, respectively, to column parallel ADCs $110_1$-$110_N$. Routing both the GR and MGRL signals to column parallel ADCs $110_1$-$110_N$ advantageously reduces the noise sensitivity of the resulting circuit, which is important because the column parallel ADCs $110_1$-$110_N$ are spread over a long distance.

In general, the global ramp signal GR is an increasing ramp signal, while the matched global ramp line signal MGRL has a constant voltage. To generate the global ramp signal GR, ramp DAC 201 counts a rising slope, and offset DAC 202 provides offset correction and shapes the global ramp signal GR. Ramp control signals $R_{131}$-$R_0$ and offset control signals $O_{19}$-$O_0$ are controlled in a manner described in more detail below.

Figure 3:
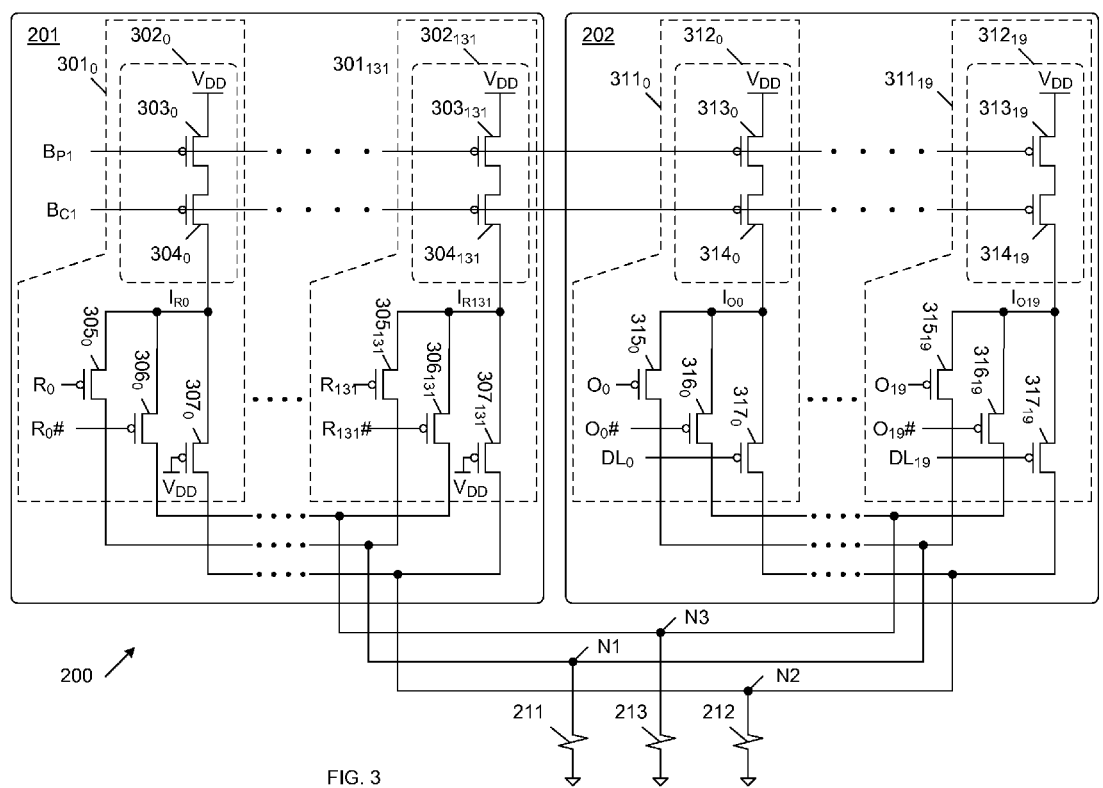
FIG. 3 is a circuit diagram illustrating details of a digital-to-analog converter used in the ramp generation circuit of FIG. 2 in accordance with one embodiment of the present invention.

FIG. 3 is a circuit diagram illustrating details of DAC 200 in accordance with one embodiment of the present invention. 12-bit ramp DAC 201 includes 132 current steering circuits $301_0$ to $301_{131}$, which are controlled by ramp control bits $R_0$ to $R_{131}$, respectively. Note that complementary ramp control bits $R_0\#$ to $R_{131}\#$ (which are typically generated by inverters) are also used to control current steering circuits $301_0$ to $301_{131}$, respectively. Similarly, 9-bit offset DAC 202 includes 20 current steering circuits $311_0$-$311_{19}$, which are controlled by offset control bits $O_0$ to $O_{19}$, respectively. Complementary offset control bits $O_0\#$ to $O_{19}\#$ are also used to control current steering circuits $311_0$ to $311_{19}$, respectively. In addition, dark level control signal $DL_0$-$DL_{19}$ are also used to control current steering circuits $311_0$-$311_{19}$, respectively.

Current steering circuits $301_0$-$301_{131}$ and $311_0$-$311_{19}$ include current sources $302_0$-$302_{131}$ and $312_0$-$312_{19}$, respectively. Current sources $302_0$-$302_{131}$ and $312_0$-$312_{19}$ include PMOS bias transistors $303_0$-$303_{131}$ and $313_0$-$313_{19}$, respectively, each of which has a source coupled to receive a $V_{DD}$ supply voltage. The gates of PMOS bias transistors $303_0$-$303_{131}$ and $313_0$-$313_{19}$ are commonly coupled to receive a first PMOS bias signal $B_{P1}$. Current sources $302_0$-$302_{131}$ and $312_0$-$312_{19}$ also include PMOS cascode transistors $304_0$-$304_{131}$ and $314_0$-$314_{19}$, respectively, each of which has a source coupled to the drain of the PMOS bias transistor located in the same current source. The gates of PMOS cascode transistors $304_0$-$304_{131}$ and $314_0$-$314_{19}$ are commonly coupled to receive a first cascode bias signal $B_{C1}$. The bias signals $B_{P1}$ and $B_{C1}$ are controlled such that current sources $302_0$-$302_{131}$ and $312_0$-$312_{19}$ provide output currents $I_{R0}$-$I_{R13}$, and $I_{O0}$-$I_{O19}$ at the drains of PMOS cascode transistors $304_0$-$304_{131}$ and $314_0$-$314_{19}$, respectively. In the described examples, the output currents $I_{R0}$-$I_{R4}$ and $I_{O0}$-$I_{O4}$ are binary weighted currents (i.e., $I_{R4}=2*I_{R3}=4*I_{R2}=8*I_{R1}=16*I_{R0}$; and $I_{O4}=2*I_{O3}=4*I_{O2}=8*I_{O1}=16*I_{O0}$), and the output currents $I_{R131}$-$I_{R5}$ and $O_{19}$-$I_{O5}$ are equally weighted currents (i.e., $I_{R131}=I_{R130}=\ldots=I_{R5}$; and $I_{O1}=I_{O18}=\ldots I_{O5}$). The binary weighted currents are routed in response to LSBs $R_0$-$R_4$ and $O_0$-$O_4$, while the equally weighted currents are routed in response to the MSBs $R_5$-$R_{131}$ and $O_5$-$O_{19}$. The value of each of the equally weighted currents is twice the value of the largest associated binary weighted current (i.e., $I_{R131}=2*I_{R4}$, and $I_{O19}=2*I_{O4}$).

Current steering circuits $301_0$-$301_{131}$ and $311_0$-$311_{19}$ also include PMOS current steering transistors $305_0$-$305_{131}$ and $315_0$-$315_{19}$, respectively; PMOS current steering transistors $306_0$-$306_{131}$ and $316_0$-$316_{19}$, respectively; and PMOS current steering transistors $307_0$-$307_{131}$ and $317_0$-$317_{19}$, respectively. The three PMOS current steering transistors in each current steering circuit each have a source commonly coupled the corresponding current source.

PMOS current steering transistors $305_0$-$305_{131}$ and $315_0$-$315_{19}$, have gates that are controlled by control signals $R_0$-$R_{131}$ and $O_0$-$O_{19}$, respectively, and drains that are commonly coupled to node N1.

PMOS current steering transistors $306_0$-$306_{131}$ and $316_0$-$316_{19}$, have gates that are controlled by complementary control signals $R_0\#$-$R_{131}\#$ and $O_0\#$-$O_{19}\#$, respectively, and drains that are commonly coupled to node N3.

PMOS current steering transistors $307_0$-$307_{131}$, have gates that are coupled to the $V_{DD}$ supply voltage, and drains that are commonly coupled to node N2. PMOS current steering transistors $317_0$-$317_{19}$ have gates that are coupled to receive dark level control signals $DL_0$-$DL_{19}$, respectively, and drains that are commonly coupled to node N2. The values of dark level control signals $DL_0$-$DL_{19}$ are selected such that the total current through transistors $317_0$-$317_{19}$ to node N2 matches a dark pixel current in array 101. As will be apparent in view of the following description, the same number of enabled transistors are coupled to both node N1 and node N2 during dark pixel conditions.

Ramp DAC 201 and offset DAC 202 combine to selectively route currents to the three resistors 211-213. As a result, voltages build up on nodes N1-N3. The voltages built up on nodes N1 and N2 of resistors 211 and 212 serve as inputs to programmable gain amplifiers 221 and 222, respectively. In response, programmable gain amplifiers 221 and 222 drive the global ramp signal GR and the matched global ramp line signal MGRL, respectively. PMOS transistors $307_0$-$307_{131}$ are all turned off in response to the $V_{DD}$ supply voltage applied to the gates of these transistors. As a result, no current from ramp DAC 201 flows through resistor 212. However, within offset DAC 202, one or more of transistors $317_0$-$317_{19}$ is turned on in response to the dark level control signals $DL_0$-$DL_{19}$. The purpose of PMOS transistors $307_0$-$307_{131}$ and PMOS transistors $317_0$-$317_{19}$ is to match the noise on node N2 to the noise on node N1 under dark pixel conditions. This is accomplished by selecting the signals $DL_0$-$DL_{19}$ such that the number (and sizes) of transistors $317_0$-$317_{19}$ turned on by these signals $DL_0$-$DL_{19}$ is equal to the number (and sizes) of transistors $315_0$-$315_{19}$ turned on by signals $O_0$-$O_{19}$ during dark pixel conditions.

The voltage built up on node N1 depends on the currents flowing through PMOS transistors $305_0$-$305_{131}$ and $315_0$-$315_{19}$ (which in turn, depends from the logic states of ramp control signals $R_0$-$R_{131}$ and offset control signals $O_0$-$O_{19}$). The voltage built up on node N1 is applied to programmable gain amplifier 221 to generate the global ramp signal GR.

Similarly, the voltage built up on node N3 depends on the currents flowing through PMOS transistors $306_0$-$306_{131}$ and $316_0$-$316_{19}$ (which in turn, depends from the logic states of ramp control signals $R_0\#$-$R_{131}\#$ and offset control signals $O_0\#$-$O_{19}\#$). The voltage built up on node N3 of resistor 213 is used for current steering, thus maintaining a constant current consumption within DAC 200, and providing a stable operating point for the PMOS transistors present in current supplies $302_0$-$302_{131}$ and $312_0$-$312_{19}$.

Figure 4:
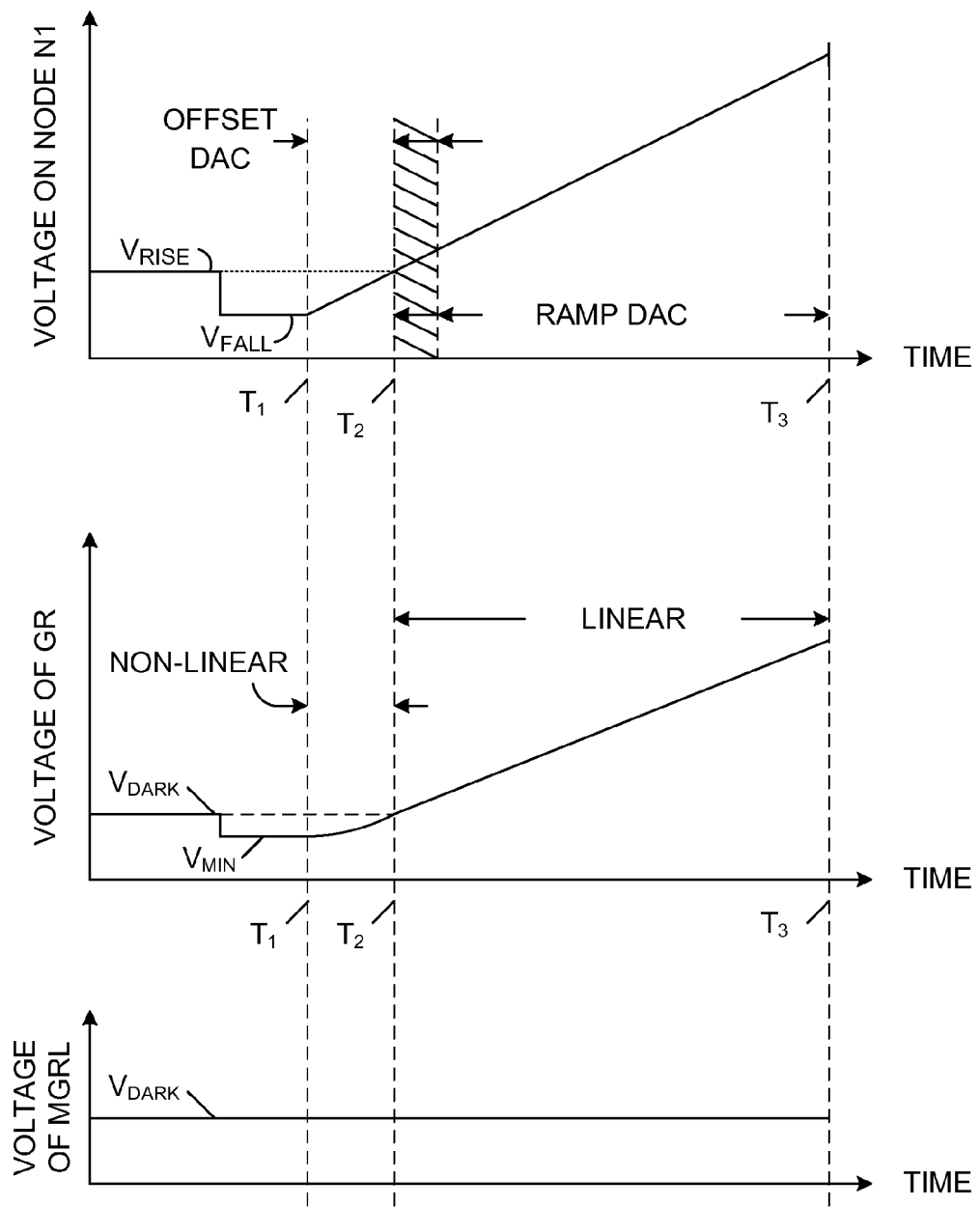
FIG. 4 is a waveform diagram illustrating the manner in which a global ramp signal GR and a matched global ramp line signal are generated from the digital-to-analog converter of FIG. 3 in accordance with one embodiment of the present invention.

FIG. 4 illustrates the manner in which the global ramp signal GR is generated from the voltage on node N1. Initially (i.e., prior to a read operation), the ramp control signals $R_0$-$R_{131}$ are all de-activated to a logic high level ($V_{DD}$), such that PMOS transistors $305_0$-$305_{131}$ are turned off. At this time, ramp DAC 201 provides a minimum current flow to node N1. Note that there are current sources (not shown), which always provide a minimum current to nodes N1 and N2, thereby developing a sufficient voltage on nodes N1 and N2 to drive each of programmable gain amplifiers 221 and 222.

The offset control signals $O_0$-$O_1$ are initially controlled to develop a constant voltage $V_{RISE}$ on node N1, wherein $V_{RISE}$ corresponds to a dark pixel condition in array 101. At this time, the control signals $O_0$-$O_{19}$ associated with PMOS transistor switches $315_0$-$315_{19}$ correspond with the dark level signals $DL_0$-$DL_{19}$ associated with PMOS transistor switches $317_0$-$317_{19}$. As a result, the number of transistors enabled in the set of PMOS transistor switches $315_0$-$315_{19}$ is equal to the number of transistors enabled in the set of PMOS transistor switches $317_0$-$317_{19}$. Consequently, the current routed to node N1 through PMOS transistor switches $315_0$-$315_{19}$ is equal to the current routed to node N2 through PMOS transistor switches $317_0$-$317_{19}$, and the voltages on nodes N1 and N2 are both equal to $V_{RISE}$. In response, programmable gain amplifiers 221 and 222 both provide an output voltage of $V_{DARK}$ (i.e., the voltage of the global ramp signal GR and the voltage of the matched global ramp line signal MGRL are both equal to $V_{DARK}$).

The offset control signals $O_{O0}$-$O_{19}$ are subsequently controlled to turn off some of the PMOS switching transistors $315_0$-$315_{19}$ that were initially turned on. As a result, the current flowing to node N1 through transistors $315_0$-$315_{19}$ is reduced, and the voltage on node N1 drops to a reduced level, $V_{FALL}$. In response, programmable gain amplifier 221 provides a reduced output voltage of $V_{MIN}$ (i.e., the global ramp signal GR is reduced to the voltage $V_{MIN}$).

Starting at time $T_1$, the offset control signals $O_0$-$O_{19}$ are then controlled to sequentially turn on PMOS switching transistors $315_0$-$315_{19}$, thereby increasing the current provided to node N1 through transistors $315_0$-$315_{19}$, such that the voltage of node N1 increases as a ramp function from the reduced voltage $V_{FALL}$. This ramp function causes the voltage of node N1 to reach the $V_{RISE}$ voltage level (and the voltage of global ramp signal GR to reach the $V_{DARK}$ voltage level) at time $T_2$.

The purpose of the voltage drop from $V_{RISE}$ to $V_{FALL}$ is to improve the linearity of the output signals provided by the narrow bandwidth programmable gain amplifier 221 (and also improve the linearity of the output signals provided by the narrow bandwidth buffers B1 and B2 in the column parallel ADCs described in more detail below). The bandwidth of DAC 200 is much higher than the bandwidth of programmable gain amplifier 221. Consequently, as illustrated in FIG. 4, programmable gain amplifier 221 provides a non-linear response between time T1 and time T2. Programmable gain amplifier 221 provides a linear response between time $T_2$ and time $T_3$. At time T2, the voltage of the global ramp signal is equal to the dark pixel voltage of the MGRL signal (i.e., $V_{DARK}$). As described in more detail below, the column parallel ADCs $110_1$-$110_N$ will not flip until after the voltage of the global ramp signal GR exceeds the dark pixel voltage $V_{DARK}$ at time $T_2$. In this manner, providing the voltage drop to $V_{FALL}$ ensures that the global ramp signal GR has a linear response during the relevant operating period of the column parallel ADCs $110_1$-$110_N$.

Note that offset control signals $O_0$-$O_{19}$ may be controlled to continue to sequentially turn on even after the voltage on node N1 reaches the voltage $V_{RISE}$ (i.e., the global ramp signal GR has reached the $V_{DARK}$ voltage level), in order to cancel ADC offset error (e.g., comparator delay) introduced by column-parallel ADCs $110_1$-$110_N$. The number of transistors sequentially turned on after the voltage on node N1 reaches the voltage $V_{RISE}$ is determined by taking an initial calibration frame. For example, if an initial calibration frame is taken at dark pixel conditions with expected average digital output of 0 DN (digital number), but the measured average digital output is actually 50 DN, then offset DAC 202 is controlled to increment 50 counts (i.e., turn on the equivalent of 50 of the smallest-weighted transistors) after the voltage on node N1 reaches $V_{RISE}$. The operating range of offset DAC 202 is selected to be capable of canceling the ADC offset error.

After offset control signals $O_0$-$O_{19}$ have canceled the ADC offset error, the offset control signals $O_0$-$O_{19}$ are held constant, Gray counter 103 is activated, and further voltage increases of the global ramp signal GR are implemented by changing the values of ramp control signals $R_{131}$-$R_0$ applied to ramp DAC 201.

In the foregoing manner, offset DAC 202 advantageously enables the column parallel ADCs $110_1$-$110_N$ to operate in a linear range, and compensates for offset error introduced by the column parallel ADCs $110_1$-$110_N$.

Starting after the offset control signal $O_0$-$O_{19}$ are held constant, the ramp control signals $R_0$-$R_{131}$ are then controlled to sequentially turn on PMOS switching transistors $305_0$-$305_{131}$, thereby further increasing the current provided to node N1, such that the voltage of node N1 continues to increase as a ramp function. In the described embodiment, the ramp control signals $R_0$-$R_{131}$ are incremented in parallel with the Gray count values GCNT[11:0]. All of the ramp control signals $R_{131}$-$R_0$ are controlled to turn on the corresponding PMOS switching transistors $305_{131}$-$305_0$ at time T3, thereby providing a maximum voltage of the global ramp signal at time $T_3$.

Programmable gain amplifiers 221 and 222 are located adjacent to each other on the same integrated circuit chip. The global ramp signal GR and the matched global ramp line signal MGRL are routed on adjacent signal paths to column ADCs $110_1$-$110_N$. As a result, the noise on these two signal paths is matched. By maintaining the MGRL signal at a voltage of $V_{DARK}$ (which corresponds with a voltage of $V_{RISE}$ on node N1), noise matching is optimized for dark pixel array conditions, where the pixel array signals are smallest, and the signal-to-noise ratio (SNR) is the worst. Noise matching for dark conditions is achieved by placing the same number of conducting and non-conducting transistors on both branches (i.e., nodes N1 and N2) for dark pixel conditions. As explained above, not all transistors are turned off during dark pixel conditions. Transistors of both branches are physically placed in proximity to further improve noise matching. Thus, transistors $305_0$-$305_{131}$ are close to transistors $307_0$-$307_{131}$, and transistors $315_0$-$315_{131}$ are close to transistors $317_0$-$317_{131}$. Therefore noise injected through these transistors is the same for both branches.

Figure 5:
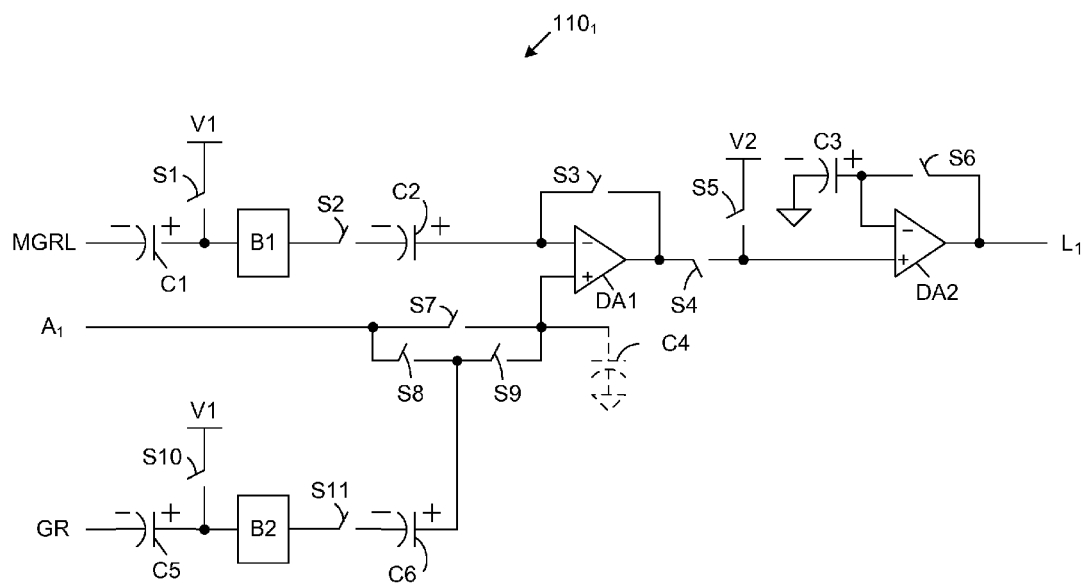
FIG. 5 is a circuit diagram of column parallel analog-to-digital converter used in the digital X-ray system of FIG. 1 in accordance with one embodiment of the present invention.

FIG. 5 is a circuit diagram of column ADC $110_1$ in accordance with one embodiment of the present invention. Column ADCs $110_1$-$110_N$ are identical in the described embodiments. Column ADC $110_1$ includes capacitors C1-C6, buffers B1-B2, differential amplifiers DA1-DA2 and switches S1-S11.

Capacitors C1 and C5 are DC blocking capacitors having positive terminals coupled to buffers B1 and B2, respectively. The positive terminals of capacitors C1 and C5 can also be coupled to receive a first reference voltage V1 through switches S1 and S10, respectively. The negative terminals of capacitors C1 and C5 are coupled to receive the MGRL and GR signals, respectively. Capacitors C1 and C5 are accumulation capacitors, which store charge in the manner described below.

The outputs of buffers B1 and B2 are coupled to the negative terminals of capacitors C2 and C6, respectively, by switches S2 and S11, respectively. Capacitors C2 and C6 are sample capacitors, which accumulate charge in the manner described below. In general, capacitor C2 samples a pixel reset level on its positive terminal, and capacitor C6 samples a pixel signal level on its positive terminal. Buffers B1 and B2 are identical buffers, which provide matched impedances at the negative terminals of capacitors C2 and C6. As described below, buffer B2 prevents the voltage on the negative terminal of capacitor C6 from affecting (via kickback) the global ramp signal GR when differential amplifier DA1 switches.

The analog pixel signal $A_1$ is provided to column parallel ADC $110_1$ on a column line. Switches S7 and S8 are configured to couple the analog pixel signal $A_1$ to the positive terminal of differential amplifier DA1 and the positive terminal of capacitor C6, respectively. The positive terminal of differential amplifier DA1 exhibits a parasitic capacitance C4. Switch S9 couples the positive terminal of capacitor C6 to the positive terminal of differential amplifier DA1. The negative input terminal of differential amplifier DA1 is coupled to both the positive terminal of capacitor C2 and the output of differential amplifier DA1 (via switch S3). In one operating phase (described below), differential amplifier DA1 samples the analog pixel signal $A_1$ applied to its negative input terminal to cancel the offset introduced by differential amplifier DA1. In another operating phase, differential amplifier DA1 operates in open loop and serves as a comparator.

The output terminal of differential amplifier DA1 is coupled to the positive input terminal of differential amplifier DA2 through switch S4. A second reference voltage V2 is also coupled to the positive input terminal of differential amplifier DA2 through switch S5. The negative input terminal of differential amplifier DA2 is coupled to both the positive terminal of capacitor C3, and to the output terminal of differential amplifier DA2 (through switch S6). The output terminal of differential amplifier DA2 provides the latch signal $L_1$. In one operating phase (described below), differential amplifier DA2 samples the second reference voltage V2 applied to its negative input terminal to cancel the offset of differential amplifier DA2. In another operating phase, differential amplifier DA2 operates in open loop and serves as a comparator.

Column ADC $110_1$ can be used with pixels having either a three transistor (3T) structure or a four transistor (4T) structure. With a 3T pixel structure, the analog pixel signal $A_1$ is a voltage that initially represents the pixel signal level, and subsequently transitions to a voltage that represents the pixel reset level. Conversely, with a 4T pixel structure, the analog pixel signal $A_1$ is a voltage that initially represents the pixel reset level, and subsequently transitions to a voltage that represents the pixel signal level. The operation of column ADC $110_1$ is described in connection with a 3T pixel structure below. However, it is understood that column ADC $110_1$ can also be used in connection with a 4T pixel structure by modifying the switching order.

FIGS. 5A-5G illustrate various operating phases of column ADC $110_1$, in accordance with one embodiment of the present invention. It is understood that column ADCs $110_1$-$110_N$ operate in parallel.

During a first phase, an exposed row of 3T pixels in array 101 are coupled to the corresponding column lines, such that the analog signals $A_1$-$A_N$ have voltages representative of the associated pixel signal levels. The voltage of analog signal $A_1$ at this time is designated $V_{PIXEL}$ (pixel signal level voltage).

The matched global ramp line signal MGRL is held at the DC voltage, $V_{DARK}$. As described above in connection with FIG. 3, $V_{DARK}$ is generated by programmable gain amplifier 222 in response to the PMOS transistors $307_0$-$307_{131}$ and $317_0$-$317_{19}$ (and an additional fixed current) in DAC 200. At this time, node N1 of DAC 200 is maintained at the voltage $V_{RISE}$, such that the global ramp signal GR provided by programmable gain amplifier 221 also has a voltage equal to $V_{DARK}$.

Figure 5A:
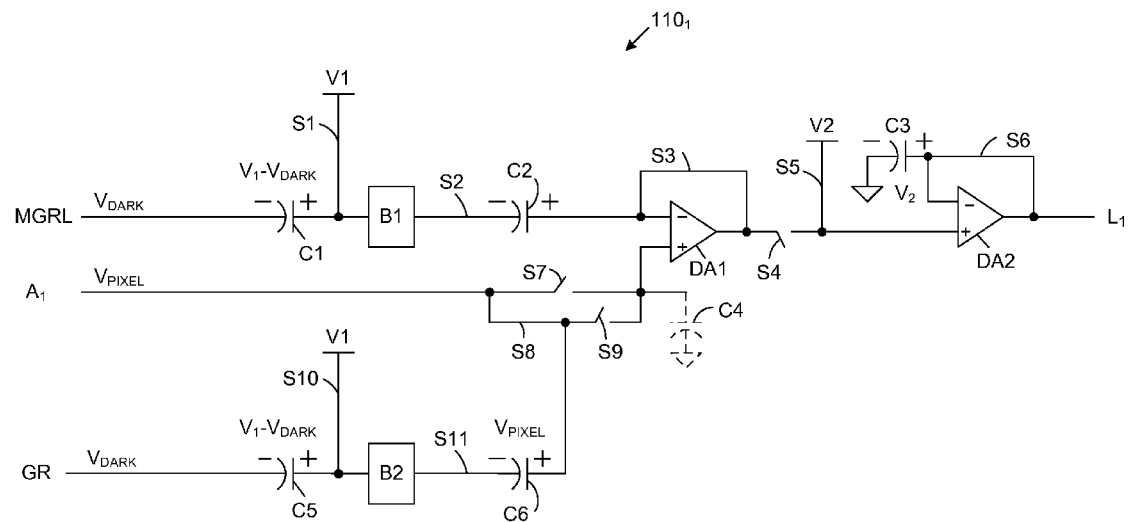
FIGS. 5A-5G are circuit diagrams illustrating various operating phases of the column-parallel analog-to-digital converter of FIG. 5, in accordance with one embodiment of the present invention.

Within column ADC $110_1$, switches S1, S2, S3, S5, S6, S8, S10 and S11 are on (conductive) and switches S4, S7 and S9 are off (non-conductive), as illustrated in FIG. 5A. Conductive switch S8 causes the analog pixel signal voltage $V_{PIXEL}$ to be applied to the positive terminal of capacitor C6, such that the positive terminal of capacitor C6 samples this voltage $V_{PIXEL}$. Conductive switch S11 couples the output of buffer B2 to the negative terminal of capacitor C6. Conductive switches S1 and S10 apply the first reference voltage V1 to the positive terminals of capacitors C1 and C5, respectively. Thus, capacitor C1 stores a voltage $V_{C1}$ equal to the first reference voltage V1 minus the voltage $V_{DARK}$ of the MGRL signal (i.e., $V_{C1}$=V1-$V_{DARK}$). Similarly, capacitor C5 stores a voltage $V_{C5}$ equal to the first reference voltage V1 minus the offset voltage $V_{DARK}$ of the global ramp signal (i.e., $V_{C5}$=V1-$V_{DARK}$). The voltages stored by capacitors C1 and C5 are therefore equal and offsetting.

Conductive switch S5 causes the second reference voltage V2 to be applied to the positive input of differential amplifier DA2. Conductive switch S6 causes this reference voltage V2 to be applied to the negative input terminal of differential amplifier DA2 and the positive terminal of capacitor C3. Because the negative terminal of capacitor C3 is coupled to ground, capacitor C3 stores a voltage equal to the second reference voltage V2.

Figure 5B:
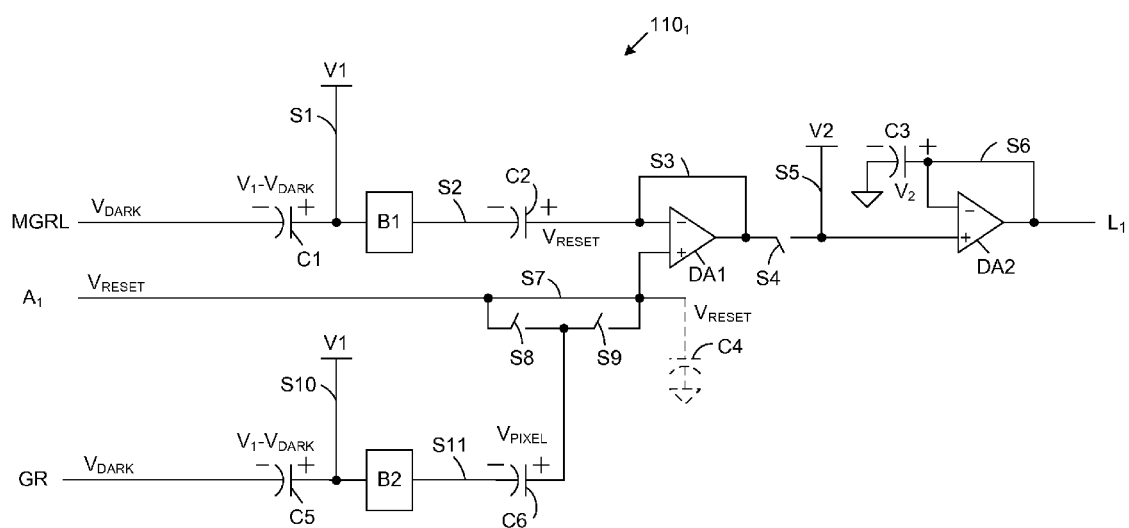

FIG. 5B illustrates the next operating phase of column parallel ADC $110_1$, wherein the analog input signal $A_1$ transitions from the pixel signal voltage $V_{PIXEL}$ to the pixel reset voltage $V_{RESET}$ (as part of the conventional read operation of the 3T pixel structure). The pixel reset voltage $V_{RESET}$ is greater than or equal to the pixel signal voltage $V_{PIXEL}$. In this operating phase, switch S8 is turned off, and switch S7 is turned on. Under these conditions, the pixel reset voltage $V_{RESET}$ is applied to the positive input terminal of differential amplifier DA1 through conductive switch S7. Conductive switch S3 causes the pixel reset voltage $V_{RESET}$ to be applied to the negative input terminal of differential amplifier DA1, as well as the positive terminal of capacitor C2. As a result, the positive terminal of capacitor C2 samples the pixel reset voltage $V_{RESET}$. Note that the sampled pixel reset voltage includes any offset introduced by the parasitic capacitance C4 of differential amplifier DA1. Conductive switch S2 couples the output of buffer B1 to the negative terminal of capacitor C2.

Figure 5C:
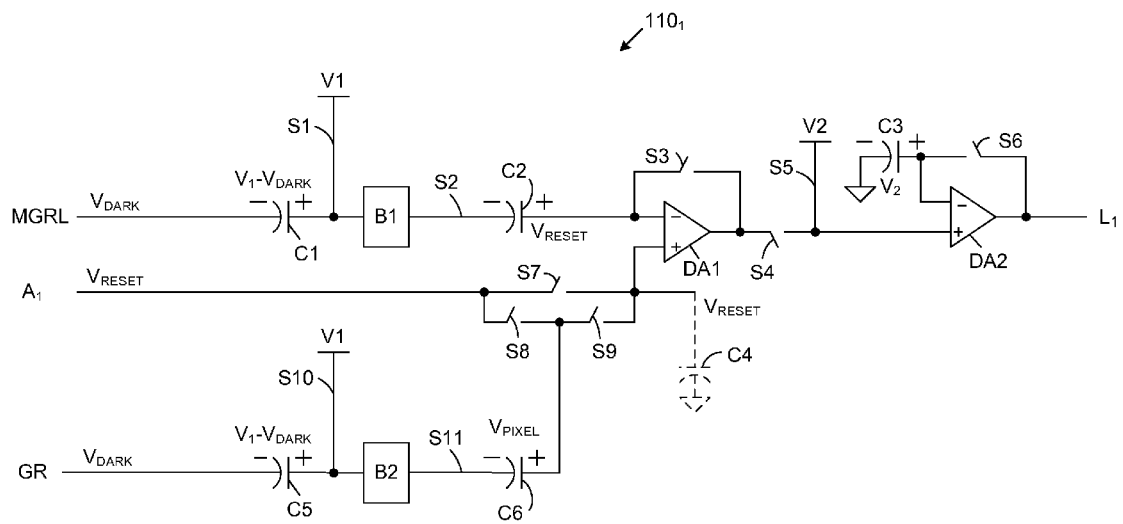

FIG. 5C illustrates the next operating phase of column ADC $110_1$, wherein switches S3, S6 and S7 are turned off. When switch S3 is turned off, capacitor C2 maintains the sampled pixel reset voltage $V_{RESET}$ on the negative input terminal of differential amplifier DA1. Similarly, when switch S7 is turned off, parasitic capacitance C4 maintains the sampled pixel reset voltage $V_{RESET}$ on the positive input terminal of differential amplifier DA1. When switch S6 is turned off, capacitor C3 maintains the sampled second reference voltage V2 on the negative input terminal of differential amplifier DA2.

Figure 5D:
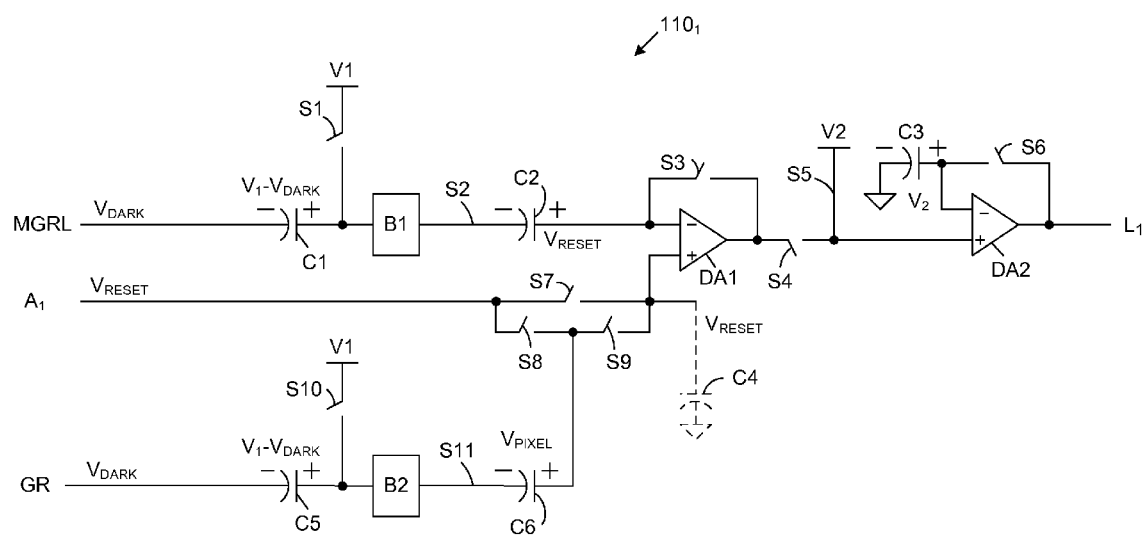

In the next operating phase, illustrated in FIG. 5D, switches S1 and S10 are turned off, thereby disconnecting the first reference voltage V1 from the positive terminals of capacitors C1 and C5, and from buffers B1 and B2.

Figure 5E:
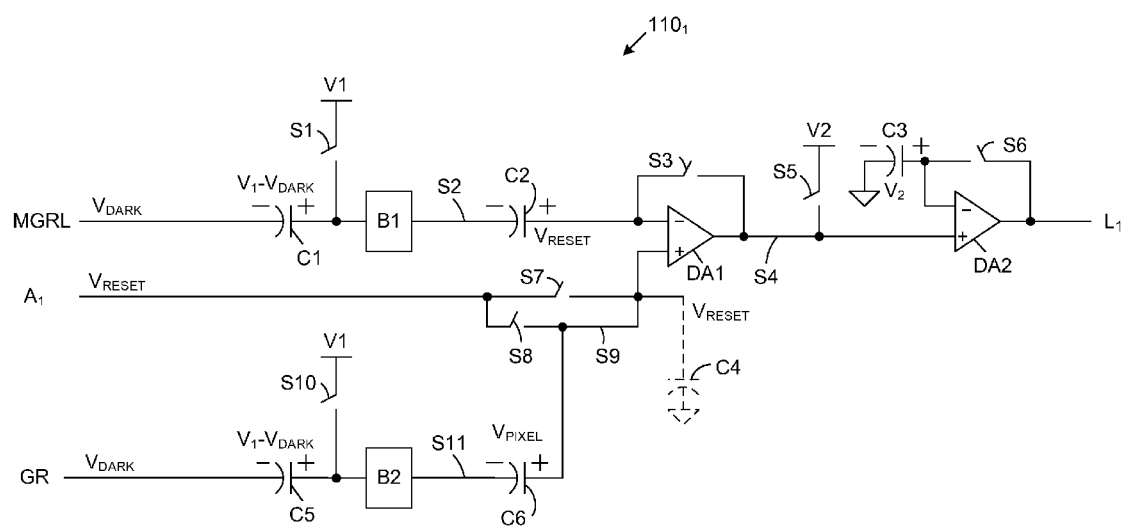

As shown in FIG. 5E, switch S9 is turned on, thereby creating a charge sharing condition on the positive input terminal of differential amplifier DA1. That is, the positive input terminal of differential amplifier DA1 receives: (1) the charge stored on the positive terminal of capacitor C6 (i.e., $V_{PIXEL}$*C6), and (2) the charge stored by parasitic capacitance C4 in response to the pixel reset voltage $V_{RESET}$ (i.e., $V_{RESET}$*C4). The voltage applied to the positive input terminal of differential amplifier DA1 can be represented as the total charge divided by the total capacitance of the positive input terminal of differential amplifier DA1. That is, the voltage applied to the positive input terminal of differential amplifier DA1 may be represented by the following equation.

$$(V_{RESET}*C4+V_{PIXEL}*C6)/(C4+C6) \quad \text{(Eqn. 1)}$$

As also shown in FIG. 5E, switch S4 is turned on, thereby coupling the output terminal of differential amplifier DA1 to the positive input terminal of differential amplifier DA2.

Under these conditions, differential amplifier DA1 operates as a comparator. Because $V_{RESET}$ is greater than or equal to $V_{PIXEL}$, the voltage on the negative terminal of differential amplifier DA1 is necessarily greater than the voltage on the positive terminal of differential amplifier DA1 at this time. As a result, differential amplifier DA1 provides a low output voltage (e.g., ground) at this time.

Differential amplifier DA2 also operates as a comparator under the conditions illustrated in FIG. 5E. The positive terminal of differential amplifier DA2 is coupled to receive the low output voltage provided by differential amplifier DA1, and the negative terminal of differential amplifier DA2 is coupled to receive the second reference voltage V2 from capacitor C3. Because the voltage on the negative terminal of differential amplifier DA2 is greater than the voltage on the positive terminal of differential amplifier DA2, differential amplifier DA2 provides a low output voltage $L_1$ (e.g., ground) at this time.

Figure 5F:
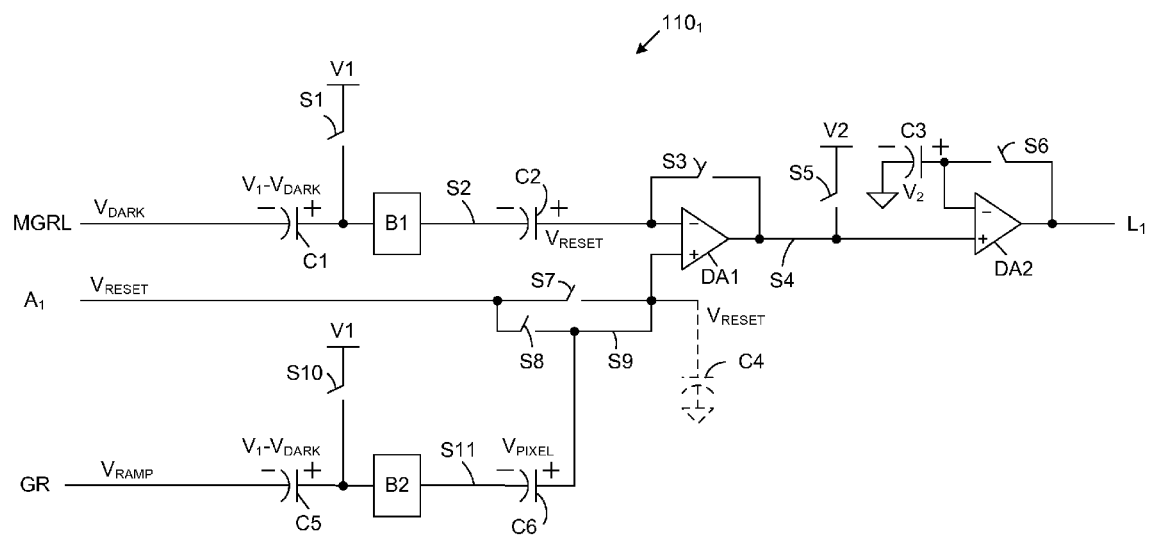

FIG. 5F illustrates the next operating phase of column ADC $110_1$, wherein offset DAC 202 is initially controlled to reduce the voltage of the global ramp signal GR to the $V_{MIN}$ voltage level by reducing the voltage on node N1 to $V_{FALL}$ (FIG. 4). Offset DAC 202 is then controlled to increase the global ramp signal GR to $V_{DARK}$ by increasing the voltage on node N1 to $V_{RISE}$, thereby causing programmable gain amplifier 221 to pass through its non-linear operating range (FIG. 4). If necessary, offset DAC 202 is further controlled to increase the voltage on node N1 to cancel any ADC offset error. After completing these steps, offset DAC 202 activates a control signal (RAMP_START) which simultaneously causes Gray code counter 103 and ramp DAC 201 to begin incrementing. Ramp DAC 201 is controlled to increase the voltage of global ramp signal GR by sequentially activating ramp signals $R_0$-$R_{131}$ to logic low voltages. In response, the global ramp signal GR increases with a single slope. In accordance with the described embodiment, the ramp signals $R_0$-$R_{131}$ are generated in response to the Gray count values GCNT[11:0] provided by Gray counter 103. As a result, the initial activation of the ramp signals $R_0$-$R_{131}$ corresponds with the initial activation of the Gray count values GCNT[11:0], thereby ensuring that the entire 12-bit range of the Gray count values is valid. That is, the 12-bit ramp DAC 201 does not contribute to increasing the global ramp signal GR until it is possible for such an increase in the global ramp signal GR to flip the output signal provided by differential amplifier DA1. The voltage of the global ramp signal GR is labeled $V_{RAMP}$ in FIG. 5F.

The increasing voltage of the global ramp signal GR causes the voltage at the positive input terminal of differential amplifier DA1 to increase. When the voltage at the positive terminal input terminal of differential amplifier DA1 exceeds the voltage applied to the negative input terminal of differential amplifier DA1, the output of differential amplifier DA1 will switch. That is, the output of differential amplifier DA1 will rise from the initial low voltage level (e.g., ground) towards the $V_{DD}$ supply voltage.

The transfer function of the global ramp signal GR to the positive input of differential amplifier DA1 is equal to C6/(C6+C4). Because the negative input of differential amplifier DA1 receives the voltage $V_{RESET}$, the output of differential amplifier DA1 will flip when the voltage on the positive input of differential amplifier DA1 reaches a voltage equal to $V_{RESET}$ (regardless of the offset introduced by differential amplifier DA1). The voltage on the positive input of differential amplifier DA1 is determined by the charge stored by capacitors C4 and C6 (see, Equation 1 above) and the voltage $V_{RAMP}$ of the global ramp signal GR. The point at which the output of the differential amplifier DA1 switches to a high state can therefore be defined by the following equation.

$$(V_{RESET}*C4 + V_{PIXEL}*C6)/(C4+C6) + V_{RAMP}*C6/(C6+C4) = V_{RESET} \quad \text{(Eqn. 2)}$$

Equation 2 can be simplified as follows:

$$[(V_{RESET}*C4 + V_{PIXEL}*C6) + V_{RAMP}*C6]/(C6+C4) = V_{RESET} \quad \text{(Eqn. 3)}$$

$$V_{RESET}*C4 + V_{PIXEL}*C6 + V_{RAMP}*C6 = V_{RESET}*(C6+C4) \quad \text{(Eqn. 4)}$$

$$V_{RESET}*C4 + V_{PIXEL}*C6 + V_{RAMP}*C6 = V_{RESET}*C6 + V_{RESET}*C4 \quad \text{(Eqn. 5)}$$

$$V_{PIXEL}*C6 + V_{RAMP}*C6 = V_{RESET}*C6 \quad \text{(Eqn. 6)}$$

$$V_{RAMP} = V_{RESET} - V_{PIXEL} \quad \text{(Eqn. 7)}$$

That is, the output of differential amplifier DA1 will flip to a high state when the voltage $V_{RAMP}$ of the global ramp signal GR equals or exceeds $V_{RESET}-V_{PIXEL}$, regardless the parasitic capacitance C4.

When the output of differential amplifier DA1 flips to a high state, the output of differential amplifier DA1 will exceed the second reference voltage V2 stored on the positive terminal of capacitor C3, and the latch signal $L_1$ provided by differential amplifier DA2 will also rise from the initial low voltage level (e.g., ground) towards the $V_{DD}$ supply voltage. Differential amplifier DA2 adds extra gain to the output of differential amplifier DA1, such that latch signal $L_1$ has a full logic voltage swing.

Because the second reference voltage V2 is a constant, differential amplifier DA2 switches when $V_{RAMP}$ is greater than ($V_{RESET}-V_{PIXEL}$), and the rise of the latch signal $L_1$ provided at the output of differential amplifier DA2 is a function of ($V_{RESET}-V_{PIXEL}$). When the latch signal $L_1$ provided by differential amplifier DA2 exceeds a predetermined threshold voltage, the count value provided by Gray code counter 103 is latched into column memory $120_1$. The count value latched in column memory $120_1$ is a 12-bit signal representative of the pixel signal level $V_{PIXEL}$.

Figure 5G:
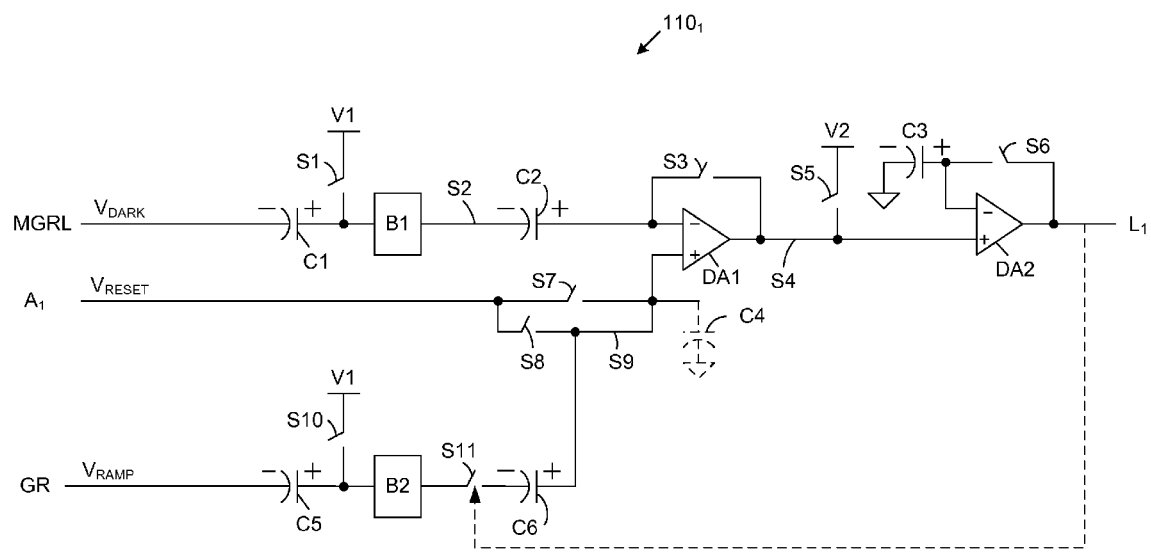

As illustrated in FIG. 5G, a feedback loop exists between the output of differential amplifier DA2 and switch S11, such that switch S11 is turned off when the latch signal $L_1$ exceeds the predetermined threshold value. This prevents the voltage on the positive terminal of capacitor C6 from rising above the $V_{DD}$ supply voltage.

As described above, the voltage difference that exists between $V_{DARK}$ and $V_{MIN}$ improves the linearity of the analog amplifiers used to implement programmable gain amplifiers 221-222, buffers B1-B2 and differential amplifiers DA1-DA2. These amplifiers typically have a narrow bandwidth, and therefore operate in a non-linear manner when initially receiving a voltage having a high (fast) slope. Assuming that the pixel reset level ($V_{RESET}$) is greater than or equal to the pixel signal level ($V_{PIXEL}$), the differential comparators DA1 and DA2 will switch and cause a counter value to be stored only when the global ramp signal GR has a voltage greater than the voltage $V_{DARK}$. Thus, the output signals provided by differential amplifiers DA1 and DA2 will only flip when the responses of the amplifiers are already linear.

Because the switching point of differential amplifier DA1 is not referenced to the pixel signal voltage $V_{PIXEL}$, but rather, to the pixel reset voltage $V_{RESET}$ stored on capacitor C2, the pixel signal voltage $V_{PIXEL}$ may be low, and not adversely affect the operation of column ADCs $110_1$-$110_N$. That is, the output of differential amplifier DA1 will flip when the voltage on the positive input terminal reaches $V_{RESET}$, such that the gain of differential amplifier DA1 does not change for different pixel signal voltages $V_{PIXEL}$, thereby enabling high linearity for large differences between the pixel signal voltage $V_{PIXEL}$ and the pixel reset voltage $V_{RESET}$, and also enabling high CMRR (common mode rejection ratio).

The biasing scheme also allows a large difference between the pixel reset voltage and the pixel signal voltage due to the use of DC separator capacitors C1 and C5. These capacitors C1 and C5 enable the global ramp signal GR to rise from a very low level (e.g., 0.5V) to a high level (e.g., 2.5 Volts), while the output of buffer B2 may be set to a different low level.

Routing the differential signals GR and MGRL along adjacent paths along the chip advantageously results in a high PSSR (power supply rejection ratio). That is, the ratio between the gain from the differential input signals to the gain from the supply noise is high.

The present invention advantageously provides a high resolution digital data output. The wide input voltage range of the present invention enables the least significant bit (LSB) voltage value to be increased, thereby providing high resolution. Note that column ADC $110_1$ is connected directly to the analog output of pixel array 101, with no circuitry in between. This direct connection is optimal in the sense that it does not suffer from any non-idealities of circuits typically found in the path between a pixel array and a column ADC input.

The present invention exhibits a low power consumption, which is important for dental X-Ray column parallel ADCs because the supply lines of the columns $C_1$-$C_N$ are very long (and therefore have relatively large resistances). Large power consumption would undesirably increase the voltage (IR) drop on these supply lines, resulting in a voltage gradient on the analog output signals $A_1$-$A_N$.

The use of input offset cancellation also provides for low current consumption in both of differential amplifiers DA1 and DA2.

The present invention also provides for a high pixel conversion rate, because full rows of pixels are converted to digital values in parallel. The high pixel ADC conversion rate results in a relatively short pixel integration time, which in turn, results in a relatively small collection of pixel dark current (assuming that pixel dark current is direct current). Thus, the parallel conversion of full rows of pixels ensures low collection of excess dark current.

The architecture of the present invention can be implemented by circuits that require a relatively small number of metal layers, single gate CMOS transistors, and no MIM capacitors, thereby enabling the use of a low cost manufacturing process.

Moreover, the architecture of the present invention uses sample and hold capacitors which are only referenced to global voltages GR and MGRL. This architecture advantageously helps to eliminate the sensitivity of column parallel ADCs $110_1$-$110_N$ to "local" DC voltages and noise.

The present invention also allows the use of accumulation capacitors, while achieving high linearity, due to the fact the parasitic input capacitance C4 of differential amplifier DA1 is cancelled (because the transfer function of the global ramp signal GR applied to the positive input terminal of differential amplifier DA1 is equal to the transfer function of the charge sharing that exists between the pixel reset voltage and the pixel signal voltage on the positive input terminal of differential amplifier DA1).

Buffers B1 and B2 advantageously prevent signal 'kick back' from column ADC $110_1$ to the global ramp signal GR when switching occurs in column ADC $110_1$. It is important to prevent signal kickback because there are many column ADCs connected in parallel to receive the global ramp signal GR, such that signal kickback from switching column ADCs would undesirably cause noise in the global ramp signal GR.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. An imaging system comprising:
    an image sensing array having a plurality of pixels arranged in rows and columns;
    a plurality of column-parallel analog-to-digital converters (ADCs), each coupled to a corresponding column of the image sensing array;
    a ramp generation circuit configured to generate a global ramp signal and a matched global ramp line signal representative of a dark pixel level of the image sensing array, wherein the ramp generation circuit is coupled to the column-parallel ADCs, such that the global ramp signal and the matched global ramp line signal are provided to each of the column-parallel ADCs.

2. The imaging system of claim 1, wherein the ramp generation circuit comprises:
    a digital to analog converter (DAC) configured to develop a first control voltage (VN1) in response to a first set of control signals, and a second control voltage (VN2) in response to a second set of control signals, wherein the global ramp signal is generated in response to the first control voltage, and the matched global ramp line signal is generated in response to the second control voltage.

3. The imaging system of claim 2, wherein the DAC includes:
    a ramp DAC configured to receive a first subset (R0-R131) of the first set of control signals and a first subset (VDD) of the second set of control signals, wherein the second subset of the second set of control signals remain constant during normal operation of the imaging system; and
    an offset DAC configured to receive a second subset (O0-O19) of the first set of control signals and a second subset (DL0-DL19) of the second set of control signals, wherein the second subset of the second set of control signals remain constant during normal operation of the imaging system.

4. The imaging system of claim 3, further comprising circuitry configured to control the second subset of the first set of control signals such that the first control voltage is less than the second control voltage, and subsequently increases until becoming equal to the second control voltage.

5. The imaging system of claim 4, wherein the column-parallel ADCs are configured to operate in a linear manner when the first control voltage value is greater than the second control voltage.

6. The imaging system of claim 4, wherein the circuitry configured to control the second subset of the first set of control signals is further configured to cause the first control voltage to increase until becoming greater than the second control voltage by an offset voltage, which is selected to eliminate an offset error of the column-parallel ADCs.

7. The imaging system of claim 4, further comprising a counter configured to start incrementing a count value when the second subset of the first set of control signals reaches a first predetermined state.

8. The imaging system of claim 7, further comprising circuitry configured to start incrementing the first subset of the first set of control signals when the second subset of the first set of control signals reaches the first predetermined state.

9. The imaging system of claim 4, further comprising circuitry configured to start incrementing the first subset of the first set of control signals when the second subset of the first set of control signals reaches a first predetermined state.

10. The imaging system of claim 1, wherein the column-parallel ADCs are configured to provide output signals that swing between two supply voltages.

11. A method of implementing an imaging system comprising:
    sampling a first analog pixel signal representative of a first pixel on a first capacitor;
    sampling a second analog pixel signal representative of the first pixel on a second capacitor, wherein the second analog pixel signal is transmitted from a first input of a comparator to a second input of the comparator; and then
    coupling the first capacitor to the first input of the comparator, and to a first control voltage having a value representative of a dark pixel value;
    coupling the second capacitor to the second input of the comparator, and to a second control voltage having a value representative of the dark pixel value; and then
    decreasing the second control voltage by an initial voltage drop; then
    increasing the second control voltage through a first voltage range until the comparator operates in a linear manner.

12. The method of claim 11, further comprising enabling a valid output of the comparator only after the second control voltage has been increased through the first voltage range.

13. The method of claim 11, further comprising increasing the second control voltage through a second voltage range while the comparator operates in the linear manner.

14. The method of claim 11, wherein the magnitude of the first voltage range is selected to be equal to the initial voltage drop.

15. The method of claim 11, wherein the magnitude of the first voltage range is selected to be greater than the initial voltage drop by an amount representative of an offset error associated with the comparator.

16. A method of implementing an imaging system comprising:
    generating a first analog signal representative of a dark pixel level of the imaging system;

applying the first analog signal to a plurality of column-parallel analog-to-digital converters (ADCs) along a first signal path;

generating a second analog signal that increases with a single-slope during a pixel measuring phase of the imaging system; and applying a second analog signal to the plurality of column-parallel ADCs along a second signal path, which extends adjacent to the first signal path.

17. The method of claim 16, wherein the first signal path and the second signal path are designed to have matching impedances.

18. The method of claim 16, further comprising:

providing analog pixel values to the column-parallel ADCs; and generating output signals with the column-parallel ADCs in response to the analog pixel values, the first analog signal and the second analog signal, wherein the output signals exhibit a full swing between a first supply voltage and a second supply voltage.

19. The method of claim 16, further comprising controlling the second analog signal to increase through a first voltage range prior to the pixel measuring phase, such that the column-parallel ADCs operate in a linear manner during the pixel measuring phase.

20. The method of claim 19, further comprising selecting the first voltage range to eliminate an offset error associated with the column-parallel ADCs.

* * * * *